United States Patent [19]

Okuhara et al.

[11] 3,961,357

[45] June 1, 1976

[54] SEMICONDUCTOR INTEGRATED CIRCUIT DEVICE

[75] Inventors: Shinzi Okuhara, Fujisawa; Ichiro Ohhinata, Yokohama, both of Japan

[73] Assignee: Hitachi, Ltd., Japan

[22] Filed: Oct. 31, 1974

[21] Appl. No.: 519,683

[30] Foreign Application Priority Data

Nov. 2, 1973 Japan............................ 48-122761

[52] U.S. Cl.................................. 357/50; 357/47; 357/49
[51] Int. Cl.².......................................... H01L 27/04
[58] Field of Search........................... 357/47, 49, 50

[56] References Cited
UNITED STATES PATENTS

| | | | |
|---|---|---|---|
| 3,648,128 | 3/1972 | Kobayashi.................. | 357/50 X |
| 3,736,193 | 5/1973 | Tucker et al. .............. | 357/50 X |
| 3,829,889 | 8/1974 | Allison et a................. | 357/49 |

Primary Examiner—Archie R. Borchelt
Attorney, Agent, or Firm—Craig & Antonelli

[57] ABSTRACT

A semiconductor integrated circuit device in which circuit elements to constitute one semiconductor integrated circuit device are divided into one group needing the dielectric isolation of the elements from one another and the other group not needing such dielectric isolation, the elements in the one group are isolated from one another in monocrystalline semiconductor regions defined through dielectric isolation in the substrate, the elements in the other group are formed in those parts of monocrystalline semiconductor region defined through dielectric isolation in the substrate which are separated by the impurity doped regions whose conductivity type is opposite to that of the monocrystalline semiconductor region, and the impurity doped region is connected to the most negative or positive potential of a circuit including at least the elements in the other group, whereby the circuit device can have a high integration density and can operate excellently even in high frequency range.

13 Claims, 7 Drawing Figures

SEMICONDUCTOR INTEGRATED CIRCUIT DEVICE

BACKGROUND OF THE INVENTION

1. FIELD of THE INVENTION

The present invention relates to a semiconductor device and more particularly to a semiconductor integrated circuit device in which a plurality of circuit elements are formed in a single substrate.

2. DESCRIPTION OF THE PRIOR ART

In general, a semiconductor integrated circuit device is fabricated and endowed with an excellent function, by forming a multiplicity of circuit elements such as resistors, diodes and transistors in a single substrate comprising silicon polycrystalline regions or silicon polycrystalline and monocrystalline regions and by electrically wiring the circuit elements. In such a case, the circuit elements must be isolated from one another in order to prevent mutual interference. A conventional way of isolating or insulating such circuit elements from one another is known as PN junction isolation method in which PN junctions are maintained in reversely biased conditions. In the PN junction isolation method, however, parasitic active and/or passive elements are formed between the circuit elements and the substrate. Therefore, this method has a drawback of lacking a desired efficiency at high frequencies, for a certain application, e.g. one to speech path elements in a communication apparatus treating high frequency signals. This method also has another drawback that if AC signals are treated PN junctions are reversely biased to invalidate the function of the PN junction of isolating the circuit elements.

There has been used a conventional dielectric isolation method to obtain a high efficiency and an excellent function, in which a dielectric film of a material such as $SiO_2$ is used as an insulating medium. In this dielectric isolation method, however, the isolation structure is more elaborate in fabricating techniques than in the PN junction isolation method, so that the integration density cannot be so much increased to maintain the dimensional precision.

SUMMARY OF THE INVENTION

One object of the present invention is to provide a semiconductor integrated circuit device which can operate very well at high frequencies and which can treat AC signals.

An additional object of the present invention is to provide a semiconductor integrated circuit device which is economical with a high integration density.

According to the present invention, it should be appreciated that even in an integrated circuit device used for a high frequency or AC circuit it is not necessary to form all of the constituent circuit elements in dielectric-isolated monocrystalline semiconductor regions, isolated from one another. The circuit elements to constitute one integrated circuit device are divided into one group needing the dielectric isolation of the elements from one another and the other group not needing such dielectric isolation. The elements in the one group are formed, isolated from one another, in some of the monocrystalline semiconductor regions defined through dielectric isolation in the substrate, and the circuit elements in the other group are formed in those parts of the other of the monocrystalline semiconductor regions which are isolated by the reverse bias voltages due to the PN junctions.

DESCRIPTION OF THE PREFERRED EMBODIMENTS

Prior to the explanation of the preferred embodiments of the present invention, an electric circuit used in a speech path switch of a communication apparatus and a semiconductor integrated circuit device fabricated by use of the conventional dielectric isolation method will be described with reference to FIGS. 1, 2a and 2b.

Figure 1:
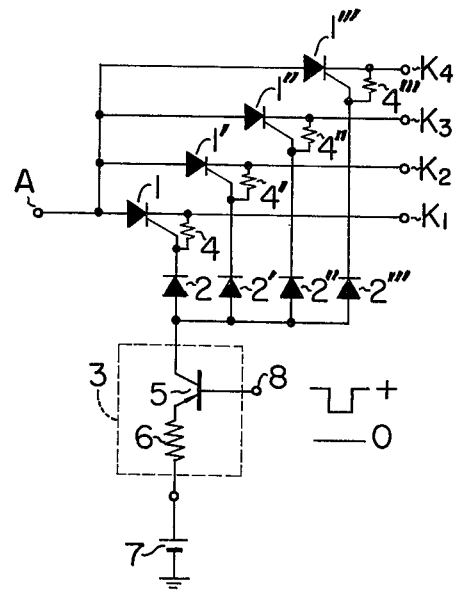
FIG. 1 shows an electric circuit used in a speech path switch of a communication apparatus.

In FIG. 1 showing an electric circuit used as a speech path switch of a communication apparatus, thyristors 1, 1', 1'' and 1''' have their anodes connected commonly to form an A terminal, their cathodes provided with terminals $K_1$, $K_2$, $K_3$ and $K_4$ respectively, and their gates connected through diodes 2, 2', 2'' and 2''' with a drive circuit 3. Resistors 4, 4', 4'' and 4''' are provided for preventing the erroneous firing of the thyristors 1, 1', 1'' and 1'''. The drive circuit 3 is in the form of a constant current switching circuit including a PNP transistor 5 and a resistor 6. The drive circuit 3 has a control terminal 8 at the base of the transistor 5 and is connected with a battery 7. The overall circuit operates in such a manner that if a voltage signal as shown in FIG. 1 is applied to crosstalks. control terminal 8, a signal applied to the terminal A is connected and transferred to selected ones of the terminals $K_1$ to $K_4$. In an application of this circuit where the signal travelling from the terminal A to the terminals $K_1$ to $K_4$ is a high frequency one such as television video signal, the thyristors 1 to 1''', resistors 4 to 4''' or diodes 2 to 2''' must be highly insulated from one another and have an almost flat frequency characteristic, in order to prevent crossstalks. However, these requirements cannot be fulfilled by the conventional semiconductor integrated circuit device using the PN junction isolation method so that the separation technique using dielectric insulation is needed for the purpose of fabricating such as a circuit in an integrated form.

Figure 2A:
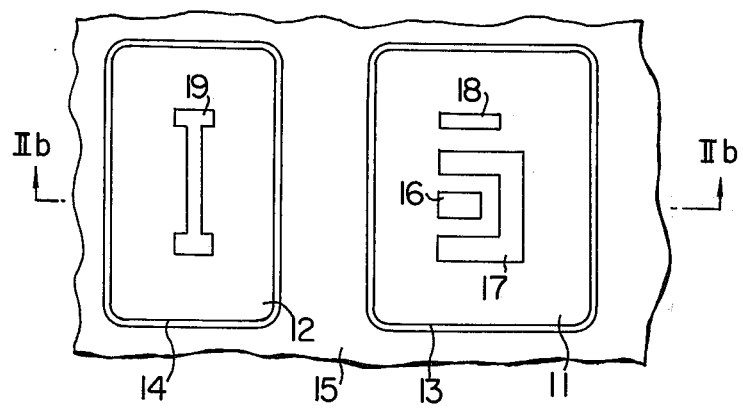
FIGS. 2a and 2b respectively show in plan and cross section a part of a semiconductor integrated circuit device fabricated by use of the conventional dielectric isolation technique.
Figure 2B:
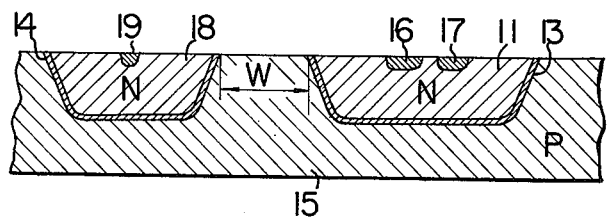

FIGS. 2a and 2b show in integrated structure the transistor 5 and the resistor 6 constituting the drive circuit 3 shown in FIG. 1, FIG. 2a and FIG. 2b respectively being a partial plain view and a cross section taken along line IIb IIb in FIG. 2a. In the FIGS. 2a and 2b, N conductivity type silicon (Si) monocrystalline regions 11 and 12 are respectively enclosed by dielectric films 13 and 14 of $SiO_2$ and supported in a silicon polycrystalline substrate 15. The N type silicon monocrystalline region 11 is provided with P conductivity type regions 16 and 17 respectively serving as an emitter and a collector and with an ohmic contact 18 serving as a base, to form a lateral PNP transistor. The N type silicon monocrystalline region 12 is furnished with a P type region 19 serving as a resistor. Thus, such a drive circuit as shown in FIG. 1 is prepared. In this circuit, since the resistor 6 is connected at a potential higher than that at which the transistor 5 is connected, they need separate isolation regions and be disposed as shown.

It is noted here that in FIGS. 2a and 2b the insulating surface layers on the semiconductor substrates and the wiring structures are omitted. (The same holds for FIGS. 3a, 3b, 4 and 5.) In this kind of dielectric isolation method, there are numerous steps of procedure such as etching of monocrystalline silicon, oxidation, growth of polycrystalline silicon, mechanical polishing, etc. and crystal defects tend to be caused in the periphery of each silicon monocrystalline region. Therefore, sufficiently large unused area must be provided around the portions where resistors or transistors are to be formed. Moreover, the width W between the monocrystalline regions must be appropriately large so as to prevent the bending and cracking of the substrate due to the differences in thermal expansion and mechanical strength between the monocrystalline region and the polycrystalline region and to improve the accuracy of fabrication. Consequently, with the conventional dielectric isolation method, the substrate needs rather a large surface area and this goes against the economy of device.

Figure 3A:
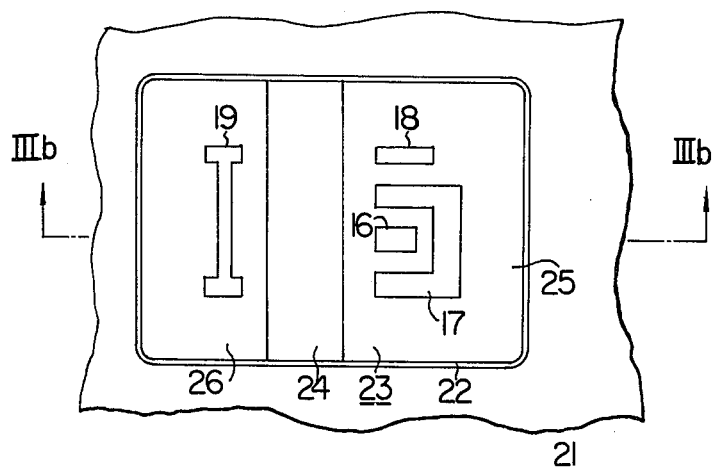
FIGS. 3a and 3b respectively show in plan and cross section a part of a semiconductor integrated circuit device as a first embodiment of the present invention.
Figure 3B:
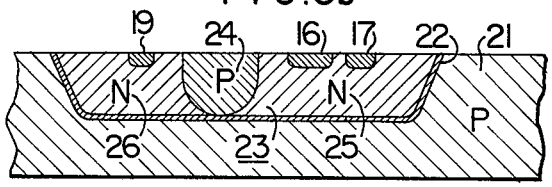

FIG. 3a shows in plan a part of a semiconductor integrated circuit device as a first embodiment of the present invention and FIG. 3b is a cross section taken along line IIIb — IIIb in FIG. 3a. In FIGS. 3a and 3b, the integrated circuit device is constituted of the same circuit elements as in FIGS. 2a and 2b. In this embodiment, a plurality of circuit elements are formed in one of the silicon monocrystalline regions formed through dielectric isolation in a substrate, with PN junctions insulating one circuit element from the others. Namely, an N type silicon monocrystalline region 23 supported in a P type silicon polycrystalline substrate 21 and separated from the substrate 21 by a dielectric material 22 is separated into two parts 25 and 26 by a deep P type impurity doped region 24 reaching the dielectric material 22. A lateral PNP transistor and a resistor are separated respectively in the parts 25 and 26. In the practical use of this semiconductor integrated circuit device, the P type impurity doped region 24 is connected at the most negative potential of the circuit including at least the circuit elements formed in the silicon monocrystalline region separated by the impurity doped region or usually grounded, so as to assure the insulating separation between the parts 25 and 26.

With such a structure, it is not necessary to provide a large unused area, which is essential for the conventional integrated circuit device in view of existing crystal defects, between the P type impurity doped region 24 and the patterns of the circuit elements. As a result, the integration density of the circuit device can be increased.

The semiconductor integrated circuit device shown in FIGS. 3a and 3b is fabricated as follows. By the conventional dielectric isolation method, there is first prepared a wafer having a plurality of N type silicon monocrystalline regions 23 supported in a P type silicon polycrystalline substrate 21 and insulated from the substrate 21 by the dielectric material ($SiO_2$) 22. Then, the entire surface of the wafter is coated with $SiO_2$ film through oxidation. The predetermined portions of the $SiO_2$ film on the selected ones of the N type silicon monocrystalline regions are removed through photoetching. P type impurity doped regions 24 to divide the N type silicon monocrystalline regions in an insulating manner are formed through the selective diffusion of the P type impurity, e.g. boron, from the portions of the wafer surface lacking $SiO_2$ film. And, the circuit elements needing dielectric insulation and the circuit elements not needing dielectric insulation are separately formed respectively in the silicon monocrystalline regions and the parts of the silicon monocrystalline regions separated through PN junction isolation. The diffusion of the impurity is performed to such an extent that the impurity doped region reaches the dielectric material 22. And, since the impurity doped region is prevented from further deepening by the dielectric material even in the continued diffusion process, the control of the diffusion process is very easy.

Figure 4:
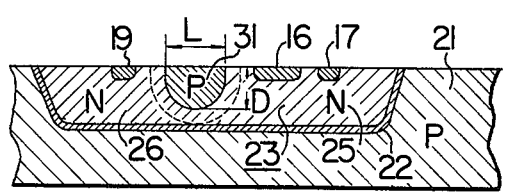
FIGS. 4 and 5 respectively show in cross section parts of semiconductor integrated circuit devices as second and third embodiments of the present invention.

FIG. 4 shows in cross section a semiconductor integrated circuit device as a second embodiment of the present invention, in which a P type impurity doped region 31 which does not reach a dielectric film 22 is used. In the embodiment shown in FIGS. 3a and 3b the P type impurity doped region 24 reaches the dielectric film 22. The other part of the structure of the embodiment of FIG. 4 is the same as the corresponding parts of the embodiment shown in FIGS. 3a and 3b. In FIG. 4, however, it should be noted here that the depth d of the impurity doped region 31 is determined in such a manner that when a reverse bias voltage is applied between the P type impurity doped region 31 and the N type silicon monocrystalline region 23, a depletion layer is formed as shown by dotted line in FIG. 4 to reach the dielectric film 22 and therefore to substantially separate the region 23 into two parts 25 and 26. Compared with the embodiment shown in FIGS. 3a and 3b, in this embodiment shown in FIG. 4 the depth D of the impurity doped region can be less, the time required for the impurity diffusion can be shortened, and the lateral extension L of the diffusion can be made smaller, so that the integration density is increased and the resultant circuit device is more economical.

Figure 5:
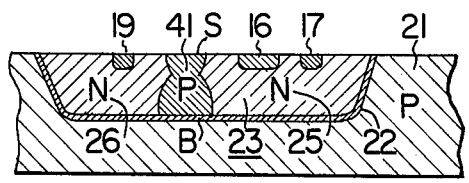

FIG. 5 shows in cross section a semiconductor integrated circuit device as a third embodiment of the present invention, in which the impurity diffusion for the PN junction isolation is performed from the opposite surfaces of an N type impurity doped region 23 to form a region 41. Except the impurity doped region 41, this embodiment is the same as the embodiment shown in FIGS. 3aand 3b. In the semiconductor integrated circuit device shown in FIG. 5, a P type impurity containing region is pre-provided at a predetermined portion B of a wafer having therein dielectric-isolated regions in the process of fabricating the wafer and the impurity diffused from the surface S join the impurity expending (that is, diffusing) from the bottom B during the diffusion of the impurity from the surface S, to form the region 41. According to this embodiment, the diffusion of the impurity from bottom starts during the step of growing the semiconductor polycrystalline region in the later stage of the process of fabricating the wafer, so that the depth of the impurity diffusion from the surface S is about a half or less than that of the impurity diffusion in the embodiment shown in FIGS. 3a and 3b. Thus, the diffusion time can be shortened and the lateral expansion of the diffusion can be made smaller, so that the integration density is increased and a further economical circuit device can be obtained.

As described above, according to the present invention, the circuit elements to constitute one integrated circuit device are divided into one group needing the use of the dielectric isolation techniques in view of efficiency and function and the other group not necessarily needing it, the circuit elements in the one group are separately provided in the silicon monocrystalline regions defined in the substrate through dielectric isolation while the circuit elements in the other group are provided in the parts separated through PN junction isolation in the silicon monocrystalline regions defined in the substrate through dielectric isolation. As a result, the completed circuit device may have a high integration density and enjoy an excellent efficiency and function at operation in a high frequency range.

Although in the previous embodiments the silicon monocrystalline regions are doped with a N type impurity and the diffusion for isolation is of a P type impurity, an alternative structure can also be employed wherein a P type silicon monocrystalline region is separated by an N type impurity doped region. In this case, the N type impurity doped region is connected to the most positive potential of the circuit. The impurity diffusion for islation can be replaced by ion inplantation technique. In any case, the PN junction for isolation must be so formed as to provide a reversely biased condition.

Moreover, although in the previous embodiments a silicon monocrystalline region is separated into two parts through impurity diffusion for isolation and only a circuit element is formed in each of the parts, it is also possible to separate the monocrystalline region into an arbitrary number of parts and to form an arbitrary number of circuit elements such as resistors in each of the parts. It is of course that circuit elements other than those mentioned in the previous embodiments can be provided in the dielectric-isolated regions in the silicon polycrystalline substrate.

Furthermore, although in the previous embodiments silicon (Si) is used, germanium (Ge), galium arsenide (GaAs), etc. may be used.

We claim:

1. A semiconductor integrated circuit device comprising a substrate, a plurality of monocrystalline semiconductor regions formed in said substrate and spaced apart from each other by a predetermined distance, each of said monocrystalline semiconductor regions being isolated by a dielectric material, a semiconductor isolation region formed in at least one of said monocrystalline semiconductor regions and extending from the surface thereof by at least a predetermined depth, said semiconductor isolation region having a conductivity type opposite to that of said at least one monocrystalline semiconductor region and said at least one monocrystalline semiconductor region being substantially separated into a plurality of parts by reversely biasing a PN junction between said semiconductor isolation region and said at least one monocrystalline semiconductor region, and at least one circuit element formed in each of the separated parts of said at least one monocrystalline semiconductor region.

2. A semiconductor integrated circuit device comprising a substrate, a plurality of silicon monocrystalline regions formed in said substrate and spaced apart from each other by a predetermined distance, each of said silicon monocrystalline regions being isolated by a dielectric material, an impurity doped region formed in at least one of said silicon monocrystalline regions, said impurity doped region having a conductivity type opposite to that of said at least one silicon monocrystalline region and separating said at least one silicon monocrystalline region into a plurality of parts, first circuit elements respectively formed in the separated parts of said at least one silicon monocrystalline region, said first circuit elements needing the dielectric isolation thereof from one another, second circuit elements respectively formed, in the other silicon monocrystalline regions, isolated from one another, said second circuit elements not needing the dielectric isolation thereof from one another, said impurity doped region being connected to the most negative or positive potential of a circuit including at least said second circuit elements.

3. A semiconductor integrated circuit device according to claim 2, wherein said impurity doped region extends from the surface of said at least one silicon monocrystalline region to the dielectric material on the bottom thereof.

4. A semiconductor integrated circuit device according to claim 2, wherein the depth of said impurity doped region is such that a deplection layer formed by applying a reverse bias between said impurity doped region and said at least one silicon monocrystalline region reaches the dielectric material on the bottom of said at least one silicon monocrystalline region.

5. A semiconductor integrated circuit device according to claim 2, wherein said substrate comprises silicon polycrystalline regions.

6. A semiconductor integrated circuit device according to claim 2, wherein said substrate comprises silicon polycrystalline regions and monocrystalline regions.

7. A semiconductor integrated circuit device according to claim 2, wherein said first circuit elements needing the dielectric isolation thereof are ones which pass high frequency signals and said second circuit elements not needing the dielectric isolation thereof are ones which do not pass high frequency signals.

8. A semiconductor integrated circuit device according to claim 2, wherein said first circuit elements needing the dielectric isolation thereof are ones which treat AC voltage and said second circuit elements not needing the dielectric isolation thereof are ones which do not treat AC voltage.

9. A semiconductor integrated circuit device comprising:
a semiconductor substrate of a first conductivity type;
a plurality of first semiconductor regions of a second conductivity type, opposite said first conductivity type, disposed in said substrate so as to be spaced apart from one another by substrate material therebetween and being isolated from said substrate by dielectric material interposed between each first semiconductor region and said substrate;
an isolation semiconductor region of said first conductivity type disposed in at least one of said first semiconductor regions and extending from the surface thereof to a prescribed depth in said at least one first semiconductor region, so as to form a PN junction with said first semiconductor region, said PN junction being reverse-biased to separate said first semiconductor region into a plurality of isolated regions; and
at least one semiconductor circuit element disposed in each of the separated isolated regions of said at least one first semiconductor region.

10. A semiconductor integrated circuit device according to claim 9, wherein said prescribed depth corresponds to the thickness of said at least one first semiconductor region.

11. A semiconductor integrated circuit device according to claim 9, wherein said prescribed depth is less than the thickness of said at least one first semiconductor region and a depletion region created by said PN junction being reverse-biased extends from said isolation region to the bottom of said at least one first region.

12. A semiconductor integrated circuit device according to claim 9, wherein said at least one first semiconductor region comprises a plurality of first semiconductor regions.

13. A semiconductor integrated circuit device according to claim 9, wherein said substrate is made of polycrystalline semiconductor material while said first semiconductor regions are made of monocrystalline semiconductor material.

* * * * *